(12) United States Patent
Liu

(10) Patent No.: US 8,638,827 B2
(45) Date of Patent: Jan. 28, 2014

(54) HIGH-POWER SEMICONDUCTOR LASER AND METHOD FOR MANUFACTURING THE SAME

(75) Inventor: XingSheng Liu, Shaanxi (CN)

(73) Assignee: XI'AN Focuslight Technologies Co., Ltd, Xi'an, Shaanxi Province (CN)

( * ) Notice: Subject to any disclaimer, the term of this patent is extended or adjusted under 35 U.S.C. 154(b) by 246 days.

(21) Appl. No.: 13/056,137

(22) PCT Filed: Dec. 28, 2009

(86) PCT No.: PCT/CN2009/001568
§ 371 (c)(1),
(2), (4) Date: Jan. 27, 2011

(87) PCT Pub. No.: WO2010/078715
PCT Pub. Date: Jul. 15, 2010

(65) Prior Publication Data
US 2011/0128987 A1 Jun. 2, 2011

(30) Foreign Application Priority Data
Jan. 9, 2009 (CN) .......................... 2009 1 0020854

(51) Int. Cl.
*H01S 5/022* (2006.01)
*H01S 5/024* (2006.01)
(52) U.S. Cl.
USPC ......... 372/36; 372/43.01; 372/44.01; 257/99; 257/E21.499
(58) Field of Classification Search
USPC ........ 257/99, E21.499; 372/36, 43.01, 44.01; 438/26
See application file for complete search history.

(56) References Cited

U.S. PATENT DOCUMENTS

2006/0279949 A1 12/2006 Shin et al.
2009/0316406 A1* 12/2009 Livesay et al. ........... 362/249.02

FOREIGN PATENT DOCUMENTS

| CN | 2457763 | Y | 10/2001 |
| CN | 201025336 | Y | 2/2008 |
| CN | 201066694 | Y | 5/2008 |
| CN | 101465516 | A | 6/2009 |
| JP | 05144867 | * | 6/1993 |
| JP | 2008-53290 | A | 3/2008 |
| WO | 2008/053753 | A1 | 5/2008 |

OTHER PUBLICATIONS

International Search Report w/translation from PCT/CN2009/001568 dated Apr. 8, 2010 (8 pages).

* cited by examiner

*Primary Examiner* — Jessica Stultz
*Assistant Examiner* — Michael Carter

(57) ABSTRACT

A high-power semiconductor laser includes a support block, an anode metal plate, a cathode metal plate and a chip. The support block has a step, and the two ends of the support block have bosses, in which there are screw holes. The chip is welded to an insulation plate, which is attached to the support block. The anode metal plate and the cathode metal plate are, respectively, welded with an anode insulation plate and a cathode insulation plate, which are welded on the step of the support block. The cathode of the chip is connected with a metal connecting plate. The metal connecting plate is connected to the anode metal plate and the cathode metal plate. The insulation plate and the anode metal plate are bonded using a gold wire in press-welding.

16 Claims, 4 Drawing Sheets

HIGH-POWER SEMICONDUCTOR LASER AND METHOD FOR MANUFACTURING THE SAME

BACKGROUND OF INVENTION

1. Field of the Invention

The invention relates to laser manufacturing, in particular to a high-power single emitter semiconductor laser and methods for manufacturing the same.

2. Background

Semiconductor laser is also called laser diode (LD). In 1980s, based on new developments in physics, such as new structures based on quantum well (QW) and strained-layer quantum well (SL-QW), refractive index modulation Bragg transmitters were developed and improved. At the same time, new crystal growth techniques, such as MBE, MOCVD and CBE, were also developed. All of these developments allowed new epitaxial techniques to precisely control crystal growth, enabling one to achieve thickness precision down to the molecular layer level, and to produce high-quality QW and SL-QW materials. Therefore, LDs made from these materials had markedly reduced the current threshold, significantly enhanced conversion efficiency, greatly improved power output, and markedly improved service life time. (With the improvements in the stability, conversion efficiency, and output power, semiconductor lasers are more widely used in laser communication, optical (laser) storage, optical gyroscope, laser printing, distance measurements, radar, etc. The market demand for semiconductor lasers is huge, and the development outlook is expanding.)

At present, although significant improvements have been made in the semiconductor laser technology, due to fast technology advancement, many industries have higher demands for semiconductor laser technology. The main issues with semiconductor lasers are low laser outputs, lower conversion efficiencies, poor performance stabilities, and high costs. These deficiencies greatly limit their application. Performance of semiconductor lasers relates to not only chip, but also heat radiation and packaging of the devices. In order to improve the reliability and stability of semiconductor lasers and to reduce associated production costs, it is necessary to design structures with more reliable packaging and more efficient heat dissipation attributes. This places higher demands on packaging design and manufacture, requiring packaging models to be simple, more efficient and have lower cost characteristics.

Currently, the most widely used high-power single-chip semiconductor lasers use C-mount (see FIG. 1A) and CT-mount (see FIG. 1B) packaging models. These two packaging modes have following flaws:

1) Low efficiency. As the power efficiencies of continuous waves generated by a single emitter semiconductor laser is only 2-3 W, if C-mount and CT-mount packaging models are used, the output power will be reduced due to limited heat dissipation.

2) High cost. CT-mount packaging typically uses copper tungsten (CuW) alloy to make the heat sink for the single emitter semiconductor laser. Because CuW alloy with gold plating is expensive, costs for manufacturing lasers of such packaging models are high.

3). Low heat-dissipation capability. In the C-mount packaging structure, the heat sink is typically located at the vertical side next to the single emitter. In operation, the laser converts about half the operation energy to heat. Because the chip is far from the thermoelectric refrigeration, heat cannot be dissipated quickly, thus resulting in heat concentration, which leads to broadened optical spectrum, wavelength shifts, and shortened product life and reduced reliability of the lasers.

4) Charged heat sink. C-mount and CT-mount packaging models use indium soldering, which causes copper support block to be electrically charged. This reduces safety of the lasers.

5) Low connection reliability. The copper support block of either C-mount or CT-mount packaging model has a single screw hole. This design allows great mechanical freedom and, therefore, results in low connection reliability of the laser.

As can be seen, there are flaws in the currently available single emitter semiconductor lasers and the technique for manufacturing them. Improvements are therefore needed. Manufacturers have tried hard looking for solutions to the above-mentioned problems. However, no suitable design has been developed so far. There is therefore an urgent need to design a new high-power semiconductor laser and to devise a method for making the same.

SUMMARY OF THE INVENTION

An objective of the invention is to overcome shortcomings associated with conventional single-emitter lasers and the process for making such lasers and to provide a new, high-power semiconductor laser and a method for making the same. A technical problem to be addressed is how to provide lasers that are safe, reliable, low cost and easy to make, have long lifetime and can produce high-power outputs. Such lasers would preferably also have better mechanical reliability and are more suitable for practical use.

Objectives of the invention are achieved by the following technical measures. In an embodiment of the invention, a high-power semiconductor laser comprises a support block, an insulation plate, a cathode metal plate, an anode metal plate and a chip. The support block has a step (notch) on one side and a boss (raised areas) on each of its two ends. The bosses have perpendicular screwed holes. The anode of the chip is welded to the middle part of an upper side surface of the insulation plate. A lower side surface of the insulation plate is attached to the support block at a position between the two bosses. The inner ends of the cathode metal plate and the anode metal plate are respectively welded with cathode insulation plate and anode insulation plate; the cathode insulation plate and the anode insulation plate are respectively welded on the step of the support block. A metal connecting plate is connected with the cathode of the chip. One end of the connecting plate is attached to one end of the cathode metal plate. The insulation plate and the anode metal plate are press welded together using a conductive material.

Objectives of the invention may further be realized with the following technical approaches.

In the above-described high-power single emitter semiconductor laser, both top and bottom surfaces of the insulation plate are gold-plated. The thickness of the gold plating is 2-5 microns.

In the above-described high-power single-emitter semiconductor laser, the chip may be a single emitter chip, a microbar or formed by a plurality of single emitter chips arranged in parallel.

In the above-described high-power single emitter semiconductor laser, the conductive materials are gold wires.

Objectives of the invention may further be realized with the following technical approaches. A method for manufacturing a high-power semiconductor laser in accordance with the invention may comprise the following steps:

1) providing a support block, an insulation plate, an anode insulation plate, a cathode insulation plate, an anode metal plate, a cathode metal plate and a metal connecting plate;

2) washing the insulation plate with organic solvent and de-ionized water, drying the insulation plate, plating the top and bottom surfaces of the insulation plate with gold, the plating thickness being 2-5 microns, and storing the gold-plated insulation plate in a cabinet filled with an inert gas;

3) attaching the anode of said chip to the gold-plated insulation plate using a soldering material, a side of the light-emitting cavity of the chip flush with a long side surface of the insulation plate, the direction of light emission from the chip being perpendicular to the long side surface of the insulation plate;

4) plating a soldering material on one side of the cathode insulation plate, one side of the anode insulation plate, and one side of the metal connecting plate, soldering one side of the cathode metal plate to the side of the cathode insulation plate having the soldering material plated thereon, and soldering one side of the anode metal plate to the side of the anode insulation plate having the soldering material plated thereon;

5) soldering the assembly of the cathode metal plate and the cathode insulation plate and the assembly of the anode metal plate and the anode insulation plate on the step of the support block;

6) arranging the gold-plated insulation plate with the chip attached thereon on the support block at a position between the two bosses;

7) attaching one end of the side of the metal connecting plate having the soldering material to the cathode of the chip and the other end to the cathode metal plate;

8) soldering the insulation plate to the support block, the metal connecting plate and the cathode metal plate together; and 9) connecting the insulation plate and the anode metal plate by press-soldering a conductive material to one end of the insulation plate and one end of the anode metal plate.

Objectives of the invention may further be realized with the following technical approaches.

In the method for making the high-power semiconductor laser described-above, the cathode insulation plate, the anode insulation plate and the support block in the step 5 are bonded together using conducting resin or gel.

In the method for manufacturing the high-power semiconductor laser described-above, the inert gas is nitrogen.

In the method for manufacturing the high-power semiconductor laser described-above, in step 5, the distance between the cathode metal plate and the anode metal plate is maintained at 0.5-1 mm in order to avoid short circuits.

In the method for manufacturing the high-power semiconductor laser described-above, the soldering in step 8 is performed with solder-reflow.

In the method for manufacturing the high-power semiconductor laser described-above, the conductive material in step 9 comprises gold wires.

Based on the technical measures described above, the high-power semiconductor laser in accordance with the present invention has the following advantages:

1) High laser output power. A single-emitter chip is directly connected to a gold-plated heat-conducting insulation plate. A copper heat sink is located directly under the insulation plate. Therefore, the distance between the chip and heat dissipating part is short. Heat dissipation capability is greatly enhanced. Using this structure for enhancing heat dissipation capability, laser output power can be substantially increased without need to worry about heat dissipation problems.

(2) Low costs and easy to make. The present invention uses gold-plated insulation plate instead of CuW heat sink. Both materials have similar thermal conductivities, whereas a gold plated CuW heat sink is more expensive than a gold-plated insulation plate. While achieving the same heat dissipation results, the invention use gold-plated insulation plate to greatly reduce manufacturing costs of the laser.

(3) High mechanical stability. The present invention uses two screw holes to effectively improve the mechanical stabilities of the laser.

(4) Improved safety. The present invention uses a gold-plated insulation plate in place of a gold-plated CuW heat sink. Because the insulation plate has better insulation effects, the heat dissipation part of the laser will not be electrically charged. Accordingly, safety of the laser is improved.

(5) Reliability and long lifetime. The high-power semiconductor laser of the present invention uses insulation plates as heat sink materials, and the design include two screw holes. These can extend the lifetime of the laser, increase its operational reliability and stability and reduce the size of the laser.

In sum, the present invention relates to a high-power semiconductor laser and a method for making the same. Such a high-power semiconductor laser comprises a support block, an anode metal plate, a cathode metal plate, and a chip. The support block has a step on one side and two bosses at two ends. The bosses have screwed holes. The chip is welded to an insulation plate; the insulation plate is attached to the support block; the cathode metal plate and the anode metal plate are welded to the cathode insulation plate and the anode insulation plate; the cathode insulation plate and the anode insulation plate are welded to the step of the support block. A metal connecting plate is attached to the cathode and anode of the chip. The insulation plate and the anode metal plate are press-welded together using gold wires. The present invention combines both C-mount and CT-mount technologies and takes advantages of good heat conduction and electric insulation. The laser has high reliability because it is welded using a hard soldering material. The linear expansion coefficients of the chip and the insulation plates match, and the insulation plate is thin. Therefore, the laser is small in size. Main applications of the present invention are in high-power semiconductor lasers, with output power greater than 0.5 W.

The above description only gives a general outline of the invention. To facilitate better understanding of the technical measures of the invention, so as to allow this invention to be practiced based on the description, detailed description of preferred embodiments are discussed below with reference to the drawings.

| | | | |
|---|---|---|---|
| 1: | support block | 2: | screw hole |
| 3: | insulation plate | 4: | cathode metal plate |
| 5: | chip | 6: | anode insulation plate |
| 7: | cathode insulation plate | 8: | copper connecting plate |
| 9: | anode metal plate | 10: | gold wires |
| 11: | bushing boss | 12: | step |

BEST MODE TO PRACTICE THE PRESENT INVENTION

Figure 1A:
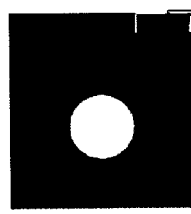
FIG. 1A and FIG. 1B show prior art C-mount and CT-mount packaging models.
Figure 1B:
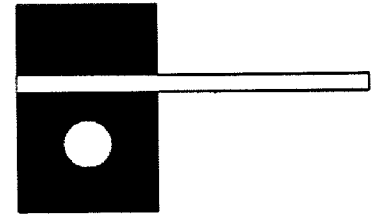
Figure 2:
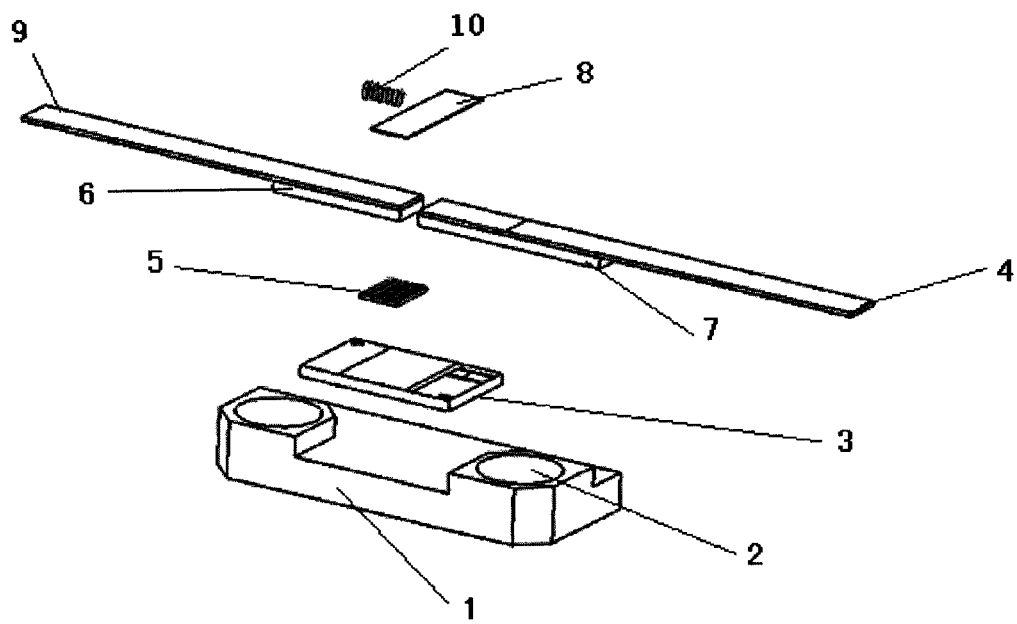
FIG. 2 shows a diagram of parts for a high-power semiconductor laser of the invention.
Figure 3:
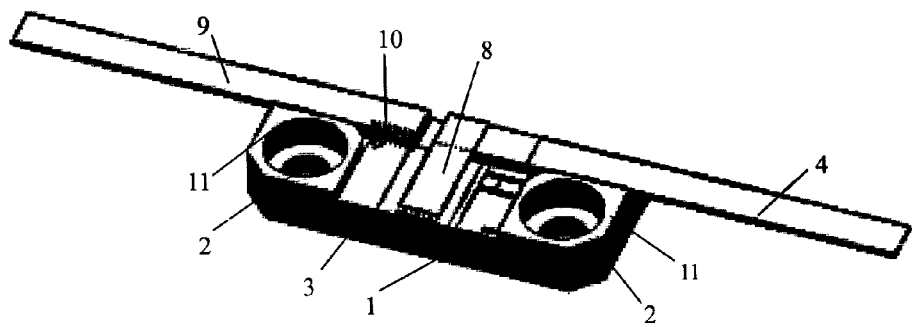
FIG. 3 shows a diagram illustrating the structure of a high-power semiconductor laser of the invention.
Figure 8:
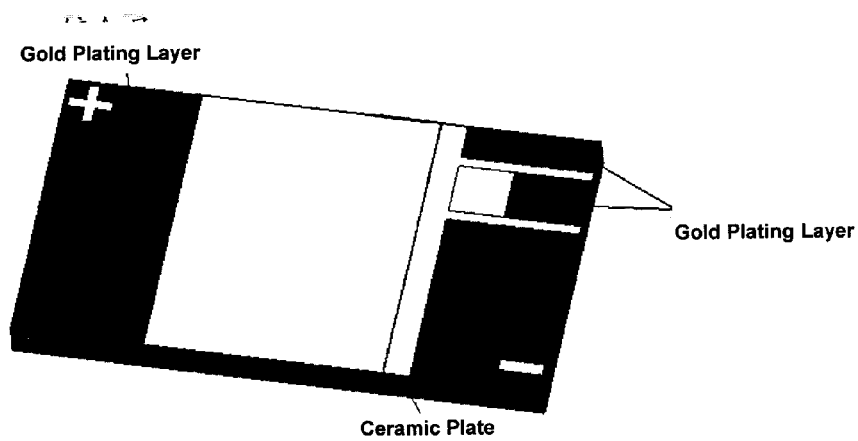
FIG. 8 shows gold-plated layer structure of insulation plate 3.

Referring to FIG. 2 and FIG. 3, a high-power semiconductor laser of the invention comprises a support block 1, an insulation plate 3, a cathode metal plate 4, an anode metal plate 9, and a chip 5. The material of support block 1 preferably has high thermal conductivity, such as, but not limited to, copper or diamond having high thermal conductivity. The material of insulation plate 3 may be aluminum nitride (AlN), beryllium oxide (BeO), or diamond having high thermal conductivity. A preferred material for the cathode metal plate 4 and the anode metal plate 9 is copper because of its high thermal conductivity and good heat dissipation capability. The support block 1 has a step 12, which spans the entire length of one side of the support block. The support block 1 has a boss 11 disposed on each end. The bosses 11 shown in FIG. 2 are rectangular, and a vertical screw hole 2 is provided in each boss 11 for fixing the laser. The anode side of said chip 5 is welded to the middle section of one side of the insulation plate 3 (an upper side surface of the insulation plate 3 is the side surface connecting to the anode side of chip 5, and a lower side surface is opposite to the upper side surface). The light emitting surface of chip 5 should be aligned with a long side surface of insulation plate 3 (i.e., the light emitting surface of the chip is next to the long side surface of insulation plate 3). The light emitting direction is perpendicular to the long side surface of the insulation plate 3 (wherein the light is emitted outwardly along a direction parallel to the top/bottom surface of the insulation plate 3, but perpendicular to the side surface of the insulation plate 3). The lower side surface of insulation plate 3 is attached to the support block 1 between the two bosses 11. Both the upper and lower side surfaces of insulation plate 3 are plated with a metal layer, wherein the metal could be gold, copper or other materials with high electrical conductivity. The plating materials on both the upper and lower side surfaces may be the same. In one embodiment, the entire bottom surface of insulation plate 3 and two ends on the top surface of insulation plate 3 are plated with gold. The shapes of the plating areas on the top surface may be as shown in FIG. 8. The thickness of the gold plating is 2-5 microns. The middle section on the top surface of insulation plate 3 may be free of gold plating. This middle section is used to attach the chip 5 with by soldering. The insulation plate 3 functions as an insulator to ensure safety of electrical connection.

One end of the cathode metal plate 4 and one end of the anode metal plate 9 are respectively welded to the cathode insulation plate 7 and the anode insulation plate 6. The cathode insulation plate 7 and anode insulation plate 6 are separately welded to the two ends of step 12 of support block 1. The cathode metal plate and the anode metal plate are kept at a distance in order to prevent short circuits. Typically, the cathode metal plate and the anode metal plate are kept at a distance of 0.5-1 mm. The cathode of the chip 5 is attached to metal connecting plate 8 (preferred materials for the metal connecting plate 8 include copper or other metals with high electrical conductivity). One end of the metal connecting plate 8 is attached to one end of cathode metal plate 4. The insulation plate 3 and the anode metal plate 9 are connected with press welding using a gold wire 10 (or other electric conductive materials). The chip 5 may be a single-emitter chip or a micro-bar. The chip 5 may also comprise multiple single-emitter chips connected in parallel. To ensure reliability of mechanical connection, support block 1 may be attached to an external positioning block using two screws inserted into the screw holes 2 on support block 1.

A method for manufacturing high-power semiconductor lasers of the invention is as follows.

1) Provide a support block 1, an insulation plate 3, an anode insulation plate 6, a cathode insulation plate 7, an anode metal plate 9, a cathode metal plate 4 and a metal connecting plate 8 (preferred materials for the metal connecting plate 8 include copper or other metals with high electrical conductivity).

2) Clean the insulation plate 3 with an organic solvent and de-ionized water. Dry the insulation plate and plate a gold layer (2-5 microns thick) on both sides of the insulation plate 3. Store the gold-plated insulation plate 3 in a cabinet filled with nitrogen or another inert gas.

3) Weld the anode of said chip 5 to the gold-plated insulation plate 3 using a solder. The side with the light emitter on the chip 5 is aligned flush with a long side surface of the insulation plate 3. The light emitting direction of the chip 5 is perpendicular to the long side surface of the insulation plate 3.

4) Plate a soldering material on one side of the cathode insulation plate 7, one side of anode insulation plate 6 and one side of metal connecting plate 8. Weld cathode metal plate 4 to the side of the cathode insulation plate 7 having the soldering material. Weld anode metal plate 9 to the side of the anode insulation plate 6 having the soldering material.

5) Weld the assembly of cathode metal plate 4 and the cathode insulation plate 7 and the assembly of anode metal plate 9 and the anode insulation plate 6 onto the step of the support block 1, keeping a distance of 0.5-1 mm between the cathode metal plate 4 and the anode metal plate 9 in order to avoid short circuits. The cathode insulation plate 7 and anode insulation plate 6 are attached to the support block 1 using a conductive adhesive.

6) Place the gold-plated insulation plate 3 (having the chip 5 attached thereto) on the support block 1 at a location between the two bosses 11.

7) Connect the solder-plated side of the metal connecting plate 8 with the cathode of the chip 5 and connect the other side of the metal connecting plate 8 to the cathode metal plate 4.

8) Weld the insulation plate 3, the support block 1, the metal connecting plate 8 and the cathode metal plate 4 together. The welding may be a reflux welding process.

9) Finally, connect the insulation plate 3 and the anode metal plate 9 together by press-welding a conductive material 10 (such as a gold wire) onto an end of the insulation plate 3 and the anode metal plate to produce a high-power semiconductor laser.

The laser of the invention operates as follows.

A forward bias potential is applied to the PN junction semiconductor material of chip 5 attached to the insulation plate 3. The P region is connected with an anode block and The N region is connected with a cathode block. The electric field caused by the forward bias potential is in an opposite direction to that of the built-in electric field within the PN junction, and reduces the ability of the built-in electric filed to inhibit electron diffusion in the crystal. Under the influence of the forward bias potential, free electrons from the N region diffuse continuously through the PN junction to the P region. When a large amount of electrons in the conductance band and holes in the valence band exist in the junction region, the free electrons and holes will recombine in the injection region. When the conductance band electrons move to the valence band, excess energy is emitted in the form of light. Heat released by the chip 5 when the semiconductor laser is in operation passes through insulation plate 3 to support block 1 and is then dissipated by the support block 1.

EXAMPLES

In accordance with the present invention, a sample 808 nm high-power single-chip semiconductor laser has been built. The wavelength of the light emitted by the semiconductor laser is 808 nm. The structure of this laser is illustrated in FIG. 3. The output power of this laser exceeds 10 W in continuous operation.

Figure 4:
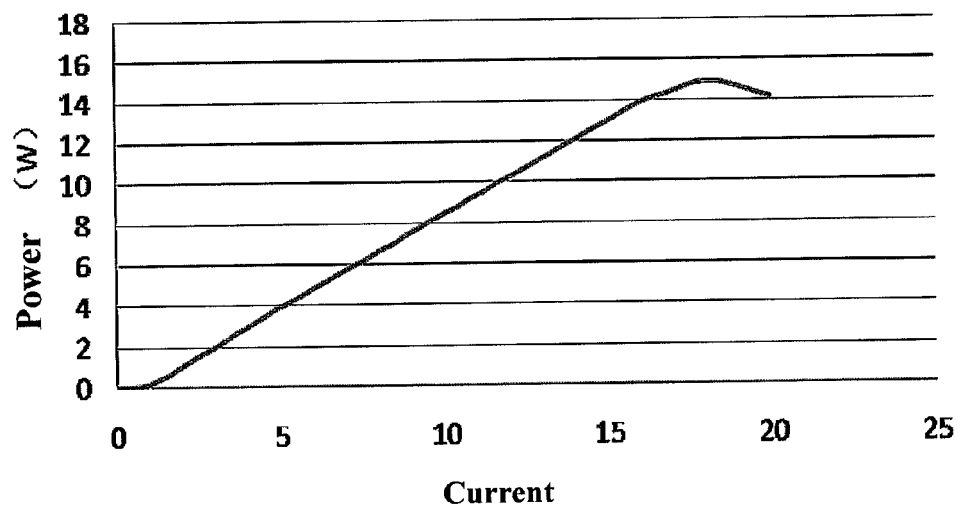
FIG. 4 shows a P-I curve of an 808 nm single emitter semiconductor laser.

The following are test results of the 808 nm high-power single-chip semiconductor laser:

(1) FIG. 4 shows a P-I curve of the sample 808 nm high-power single emitter semiconductor laser sample. The highest light output of this laser is 15 W.

Figure 5:
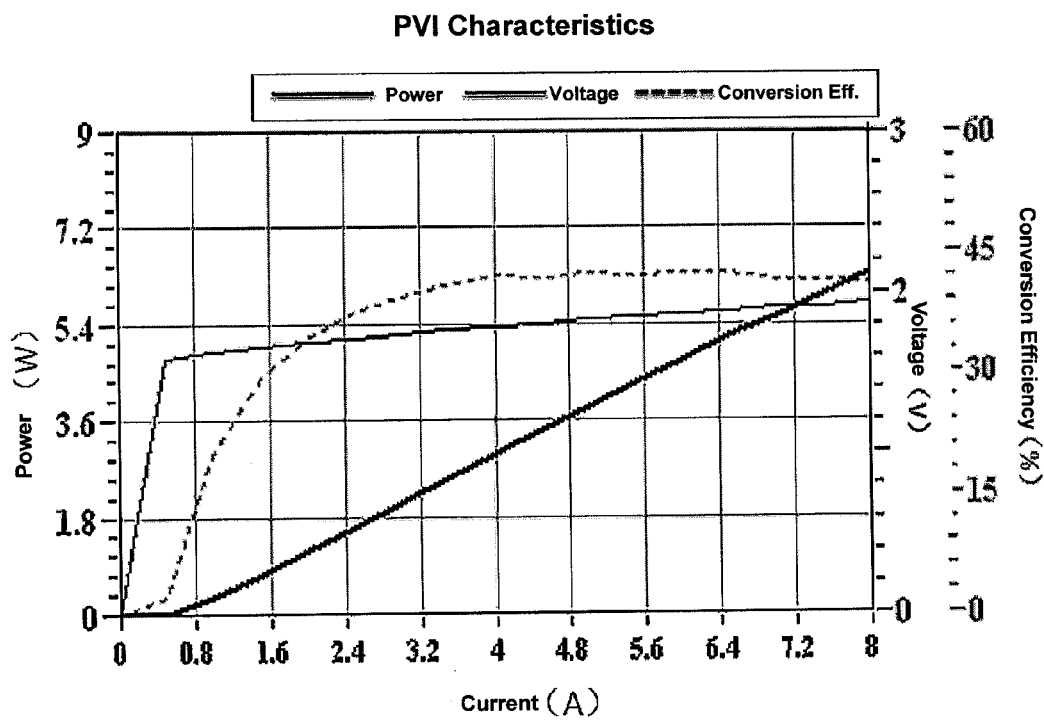
FIG. 5 shows an LIV curve of an 808 nm single emitter-semiconductor laser.

(2) FIG. 5 show test results of the laser operating to output 6 W power, at which level high reliability of this laser can be ensured. In this test, the working current is 7.38 A, the working potential (voltage) is 1.91V, the threshold current is 0.65 A, the slope efficiency is 0.87 W/A, typical electro-optic conversion efficiency is 41.35%, the maximal electro-optic conversion efficiency is 42.42%, and series resistance is 40.16 milliohm.

Figure 6:
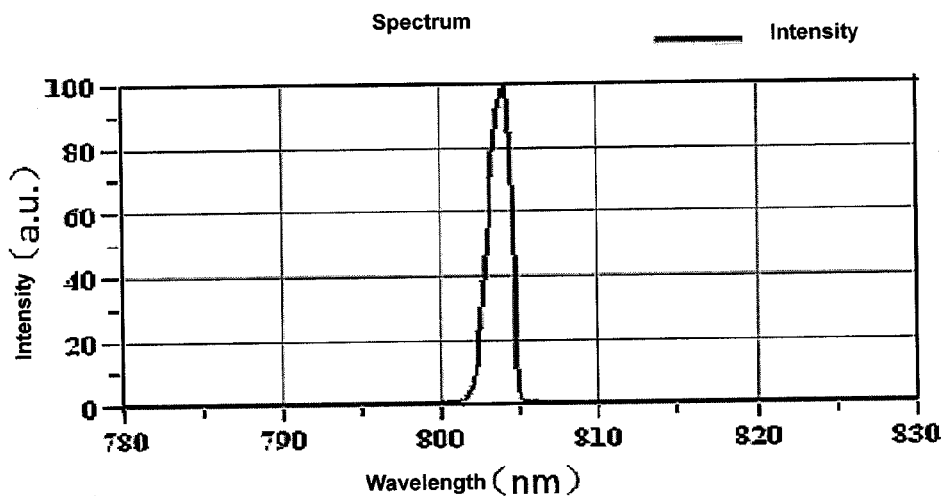
FIG. 6 shows spectral test results of an 808 nm single-semiconductor laser.

(3) FIG. 6 show spectral test results of the sample 808 nm single emitter semiconductor laser sample. The maximum wavelength of this laser is 804.24 nm, the median wavelength is 804.12 nm, the full width at half maximum (FWHM) is 1.61 nm, and the full width at 90% energy (FW90%E) is 2.48 nm.

Figure 7:
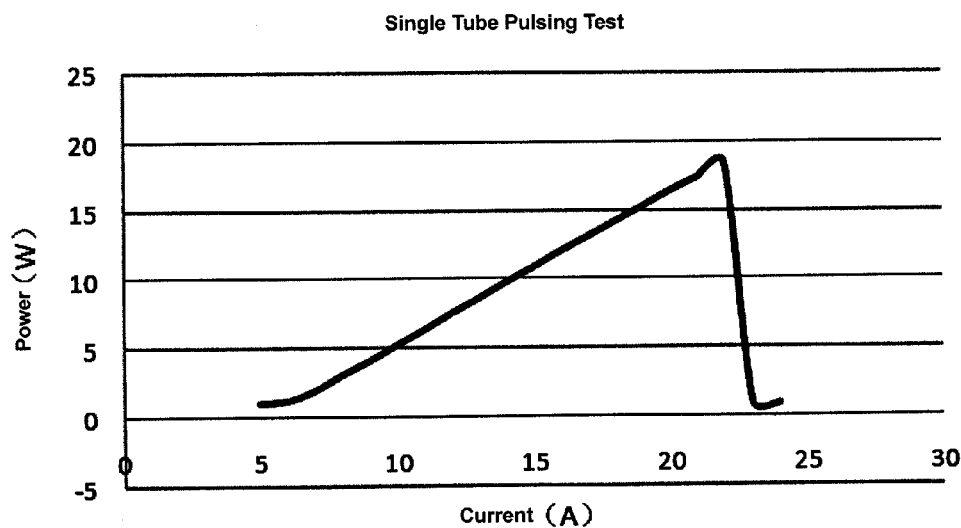
FIG. 7 shows a P-I curve of an 808 nm single emitter semiconductor laser under pulsing conditions.

(4) FIG. 7 shows test results of a sample laser of the present invention operating at its extreme level of output at 200 μs and 400 Hz. The maximum light output power is close to 20 W.

In summary, the present invention uses a compound-type packaging structure and combines the advantages of C-mount and CT-mount packaging models. Embodiments of the invention have advantageous heat conduction and electric insulation properties. These lasers are highly reliable due to the use of hard soldering materials (AuSn). The linear expansion coefficients of the chip (such as GaAs) and the insulation plates are better matched. The insulation plate can be made thin, for example, less than 0.5 mm. The main applications of embodiments of the present invention relate to high-power semiconductor lasers, having an output power of 3 W or higher.

The above describes only preferred embodiments of the invention and is not meant to limit the invention in any form. Although the best mode of practicing the invention has been described, this should not be used to limit the scope of the invention. Any person of ordinary skill in the art could modify or vary above embodiments and make equivalent embodiments based on the above described without departing from the scope of the invention. Any simple modifications, equivalent changes and modifications, based on technology and embodiments of the present invention, should be considered to fall within the scope of this invention.

INDUSTRIAL APPLICABILITY

The high-power single emitter semiconductor lasers of the present invention can be applied in communication, computer technology (primarily, data storages and input/output devices), film and video, aerospace, aviation, medicine, entertainment, research, art craft, night vision lighting, entertainment display, and similar industries.

The invention claimed is:

1. A high-power single emitter semiconductor laser, comprising a support shoe, an insulation sheet, a cathode plate, an anode plate, and a chip, wherein the support shoe has a step on one side, the support shoe has bushing bosses on two ends, the bushing bosses have vertical screwed holes, an anode of the chip is welded to a middle section on an upper side of the insulation sheet, a lower side of the insulation sheet contacts the support shoe at a location between the two bushing bosses, an inner end of the cathode plate and an inner end of the anode plate are welded with a cathode insulation sheet and an anode insulation sheet, respectively, the cathode insulation sheet and the anode insulation sheet are welded on the step of the support shoe, a metal connecting sheet is connected to a cathode of the chip, one end of the metal connecting sheet is connected with the cathode plate, the insulation sheet and the anode plate are pressure welded together using a conductive material, wherein a light emitting face of the chip is aligned with a long side of the insulation sheet, a light emitting direction is perpendicular to a ling side of the insulation sheet, wherein the light emitting direction is parallel with a plane surface of the insulation sheet and perpendicular to the side surface of the insulation sheet for emitting outwardly light.

2. The high-power single emitter semiconductor laser, as recited in claim 1, wherein both the upper and lower sides of the insulation sheet are plated with a metal layer, wherein the plating materials on both the upper and lower sides are of the same material.

3. The high-power single emitter semiconductor laser, as recited in claim 1, wherein the upper and the lower sides of the insulation sheet have gold plating of 2-5 microns thick on.

4. The high-power single emitter semiconductor laser, as recited in claim 2, wherein the upper and the lower sides of the insulation sheet have gold plating of 2-5 microns thick on.

5. The high-power single emitter semiconductor laser, as recited in claim 1, wherein the chip can be a single-cavity emitter chip, a microbar, or an array of a plurality of single-cavity emitter chips connected in parallel.

6. The high-power single emitter semiconductor laser, as recited in claim 2, wherein the chip can be a single-cavity emitter chip, a microbar, or an array of a plurality of single-cavity emitter chips connected in parallel.

7. The high-power single emitter semiconductor laser, as recited in claim 3, wherein the chip can be a single-cavity emitter chip, a microbar, or an array of a plurality of single-cavity emitter chips connected in parallel.

8. The high-power single emitter semiconductor laser, as recited in claim 4, wherein the chip can be a single-cavity emitter chip, a microbar, or an array of a plurality of single-cavity emitter chips connected in parallel.

9. The high-power single emitter semiconductor laser, as recited in claim 1, wherein the conductive material comprises a gold wire.

10. The high-power single emitter semiconductor laser, as recited in claim 2, wherein the conductive material comprises a gold wire.

11. The high-power single emitter semiconductor laser, as recited in claim 3, wherein the conductive material comprises a gold wire.

12. The high-power single emitter semiconductor laser, as recited in claim 4, wherein the conductive material comprises a gold wire.

13. The high-power single emitter semiconductor laser, as recited in claim 5, wherein the conductive material comprises a gold wire.

14. The high-power single emitter semiconductor laser, as recited in claim 6, wherein the conductive material comprises a gold wire.

15. The high-power single emitter semiconductor laser, as recited in claim 7, wherein the conductive material comprises a gold wire.

16. The high-power single emitter semiconductor laser, as recited in claim 8, wherein the conductive material comprises a gold wire.

\* \* \* \* \*